United States Patent [19]
Warren

[11] Patent Number: 5,544,240
[45] Date of Patent: Aug. 6, 1996

[54] IMAGE PROCESSING APPARATUS WITH IMPROVED DATA CONVERSION TESTING

[75] Inventor: Paul Warren, Basildon, England

[73] Assignee: International Business Machines Corporation, Armonk, N.Y.

[21] Appl. No.: 382,940

[22] Filed: Jan. 31, 1995

Related U.S. Application Data

[63] Continuation of Ser. No. 965,814, Oct. 23, 1992, abandoned.

[30] Foreign Application Priority Data

Nov. 14, 1991 [EP] European Pat. Off. ............. 91310541

[51] Int. Cl.⁶ .................................................. G06K 9/38
[52] U.S. Cl. .................................................. 382/270
[58] Field of Search ................................ 382/270, 271, 382/272, 273; 348/417, 421, 422, 571, 574

[56] References Cited

U.S. PATENT DOCUMENTS

| | | | |
|---|---|---|---|
| 4,205,341 | 5/1980 | Mitsuya et al. | 382/50 |
| 4,647,968 | 3/1987 | Willis | 348/574 |
| 4,677,479 | 6/1987 | Hatori et al. | 382/50 |
| 4,695,884 | 9/1987 | Anastassiou et al. | 382/51 |
| 4,890,161 | 12/1989 | Kondo | 348/421 |
| 4,933,761 | 6/1990 | Murakami et al. | 348/422 |

OTHER PUBLICATIONS

Boris Akodes, Testing and Characterization of Digital Video Devices Using an Advanced Analog VLSI Test System Architecture, 1990 IEEE, Teradyne, Inc., Boston, MA. pp. 114, 115.

T. Noguchi, A. Murakami, M. Kawai and Y. Hayasaka, Testing for a Solid- State Color Image Sensor, 1986 International Test Conference, pp. 683—685.

*Primary Examiner*—Jose L. Couso
*Attorney, Agent, or Firm*—Jeffrey S. LaBaw

[57] ABSTRACT

An image processing apparatus comprises a first memory for storing a plurality of data words corresponding to different pixels of a test image, each data word being set to a common test data value. The data words are converted into one or more analog video signals using an digital to analog convertor. The one or more video signals are converted, using an analog to digital convertor, into captured data values with each captured data value corresponding to a different one of the data words stored in the first memory. The captured data values are stored in a second memory and averaged to generate a mean captured value. Any difference between the mean captured value and the test data value is determined to identify any amplification error in the captured data values. First and second tolerance values are set to be respectively greater than and less than the mean captured value. The captured data values between the first and second tolerance limits are then counted to identify any quantization errors in the captured data values.

11 Claims, 5 Drawing Sheets

IMAGE PROCESSING APPARATUS WITH IMPROVED DATA CONVERSION TESTING

This is a continuation of application Ser. No. 07/965,814 filed Oct. 23, 1992, now abandoned.

BACKGROUND OF THE INVENTION

The present invention relates to image processing apparatus in which image data conversion is tested automatically by wrapping test image data.

An image processing apparatus, such as, for example, a multimedia computer system, typically comprises an image capture adaptor having an analog to digital (A to D) convertor for digitizing successive frames of an analog video signal generated by a video source such as a video camera, video tape player or the like. The digitized frames are usually stored in a memory of the computer system from which they can be accessed and modified under the control of application software before transfer, via an digital to analog (D to A) convertor in the image capture adaptor, to an analog video output device such as a visual display unit, video tape recorder or the like.

The digitized frames can be degraded during both capture and replay operations. Specifically, individual pixels of the image frames can be degraded by quantization errors introduced by the D to A and A to D conversion hardware. Signal amplification during both capture and replay operations can also degrade the image frames. The degradation is conventionally identified manually by visual inspection of replayed images. However, such inspection is extremely subjective and may be adversely affected by environmental factors such as, for example, ambient lighting. Furthermore, it may not be possible to distinguish, by visual inspection, between faults located in the conversion hardware and faults located in the amplification hardware.

SUMMARY OF THE INVENTION

In accordance with the present invention there is provided a method of automatically testing data conversion in image processing apparatus, the method comprising: storing, in a first memory, a plurality of data words corresponding to different pixels of a test image, each data word being set to a common test data value; converting the data words into one or more analog video signals using an digital to analog convertor; converting the one or more video signals into captured data values using an analog to digital convertor, each captured data value corresponding to a different one of the data words stored in the first memory; storing the captured data values in a second memory, averaging the captured data values stored in the second memory to generate a mean captured value; determining any difference between the mean captured value and the test data value to identify any amplification error in the captured data values; determining first and second tolerance values respectively greater than and less than the mean captured value; and counting the captured data values between the first and second tolerance limits to identify any quantization errors in the captured data values.

The present invention is based on the realization that quantization faults can be automatically distinguished from amplification faults by feeding back or "wrapping" a test image from the output of the apparatus to the input, averaging captured pixel data to generate a mean, setting tolerance limits with respect to the mean, and determining the fraction of captured pixels falling within the tolerance limits. The fraction provides a measure of degradation of the image due to quantization errors introduced by the conversion hardware. The difference between the mean and the test image data provides a measure of degradation of the image due to amplification.

Preferably, the method includes comparing the difference, if any, between the mean captured value and the test data value with a first threshold. This advantageously provides automatic detection of a functional fault in the image processing apparatus.

The method may also include comparing the number of captured data values between the first and second tolerance limits with a second threshold. This advantageously provides automatic detection of a conversion fault in the analog to digital convertor or the digital to analog convertor.

Furthermore, the method may include determining which one of a plurality of reference data distributions stored in a look up table substantially corresponds to the captured data values. This advantageously provides automatic location of the conversion fault.

Viewing a second aspect of the present invention, there is provided an image processing apparatus comprising: a first memory for storing a plurality of data words corresponding to different pixels of an image; a digital to analog convertor for converting the data words into one or more analog video signals; an analog to digital convertor for converting the one or more video signals into captured data values, each captured data value corresponding to a different one of the data words stored in the first memory; and a second memory for storing the captured data values; characterized in that the apparatus further comprises analyzer logic connected to the first and second memories, the analyzer logic including: means for setting each data word in the first memory to a common test data value; means for averaging captured data values derived from the test data value to generate a mean captured value; means for determining any difference between the mean captured value and the test data value to identify any amplification error in the captured data values; means for determining first and second tolerance values respectively greater than and less than the mean captured value; and means for counting the captured data values between the first and second tolerance limits to identify any quantization errors in the captured data values.

Because the image processing apparatus of the present invention is self-testing, it is more reliable in identifying and locating faults than conventional manual, and therefore, subjective, inspection.

In a particularly preferred example of the present invention in the form of a computer system, the analyzer logic comprises: means for comparing the difference, if any, between the mean captured value and the test data value with a first threshold to detect a functional failure in the image processing apparatus; means for comparing the number of captured data values between the first and second tolerance limits with a second threshold to detect a conversion fault in the analog to digital convertor or the digital to analog convertor; and means for determining which one of a plurality of reference data distributions stored in a look up table substantially corresponds to the captured data values to locate the conversion fault.

BRIEF DESCRIPTION OF THE DRAWINGS

Preferred embodiments of the present invention will now be described with reference to the accompanying drawings in which.

DETAILED DESCRIPTION OF THE DRAWING

Figure 1:
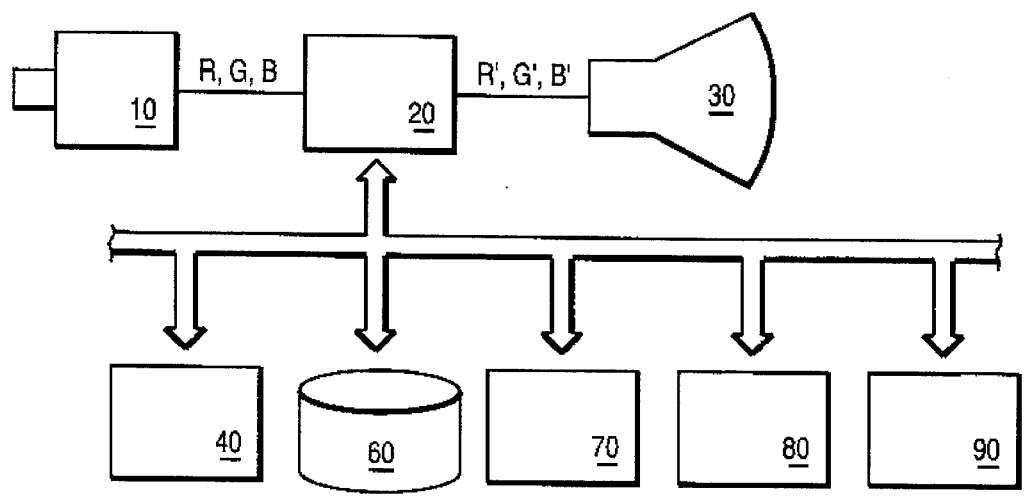
FIG. 1 is a block diagram of image processing apparatus of the present invention in the form of a multimedia computer system.

Referring first to FIG. 1, a multimedia computer system typically comprises an analog color video source 10 such as a color video camera, television receiver, video tape player or the like. The video source 10 has red, green and blue analog video outputs, R, G, and B, connected to an image capture adaptor 20. The image capture adaptor 20 has red green and blue analog video outputs R', G', and B', connected to a video output device 30 such as a video tape recorder, visual display unit or the like. The image capture adaptor 20 also has digital inputs and outputs connected to a bus architecture 50 of a host computer system such as a personal computer. The host computer system comprises a central processing unit 90, random access memory 80, read only storage 70, and large capacity storage 60 such as a hard disk drive, tape streamer or the like, all interconnected by the bus architecture 50. The bus architecture 50 may also be connected to other computer systems in a local area network 40. It will be appreciated that the image capture adaptor 20 may be in the form of a peripheral card adapted to be releasably connected to the bus architecture 50 of the host computer system.

In operation, the image capture adaptor 20 converts the R, G, and B video signals from the input video source 10 into digitized luminance, Y, saturation, U, and hue, V, signals. Conventionally, U and V are referred to as chrominance signals. The central processing unit 90, under the control of an application computer program, can treat the digitized Y, U and V signals as data that can be stored as a data file in the random access memory 80 or the storage device 60; communicated to other computer systems on the local area network 60; or adapted in the image capture adaptor 20 for output to the video output device 40.

Figure 2:
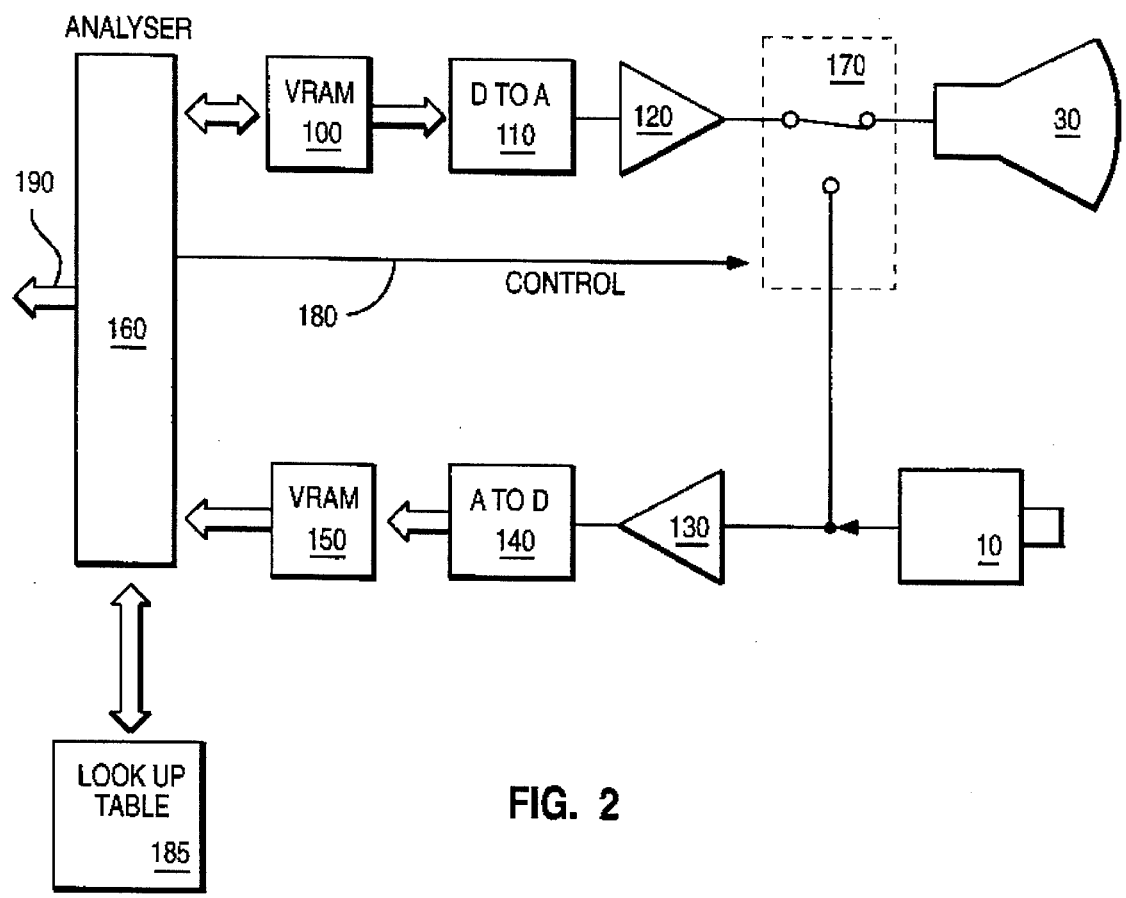
FIG. 2 is a block diagram of an image capture adaptor of the multimedia computer system.

Referring now to FIG. 2, the image capture adaptor 20 comprises a display video random access memory (VRAM) 100 connected to a digital to analog (D to A) convertor 110. The Y, U and V values corresponding to each pixel of an image stored in the display VRAM 100 are defined by nine bits. The D to A convertor 110 converts the digitized Y, U, and V signals corresponding to the stored image into the R', G' and B' analog video signals for output to the video output device 30 via an output buffer 120. The adaptor 20 also comprises a capture VRAM 150 connected to an analog to digital (A to D) convertor 140. The A to D convertor 140 converts the R, G, and B video signals received from the video input source 10 via an input buffer into digitized Y, U, and V video signals. The Y, U and V values corresponding to each pixel of an image digitized by the A to D convertor 140 are recorded in the capture VRAM 150 by nine bits.

Figure 3:
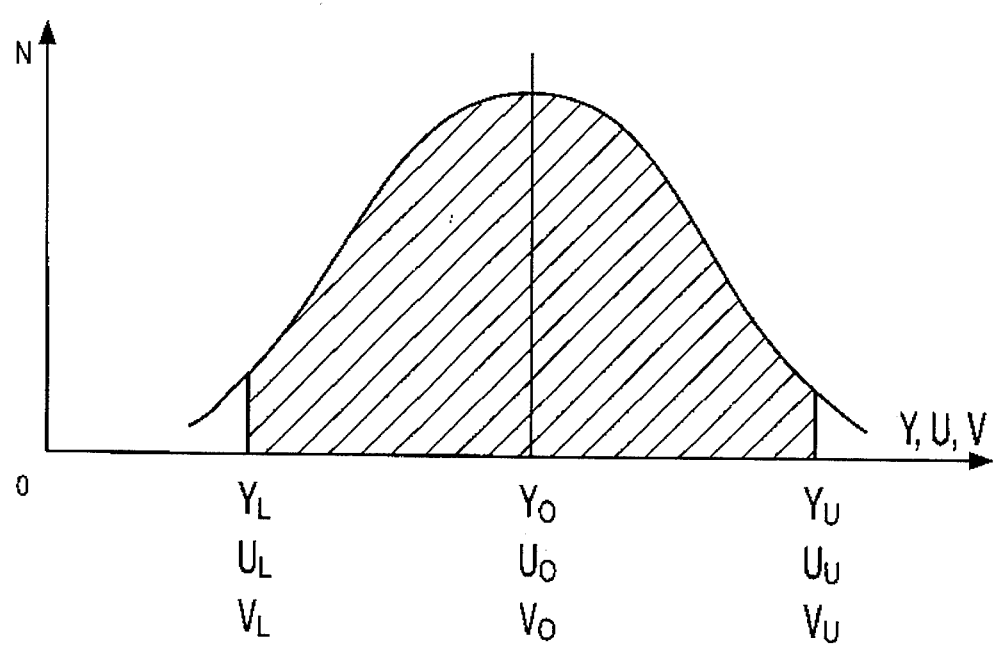
FIG. 3 is a graph of a typical captured pixel distribution about a test pixel value.
Figure 4:
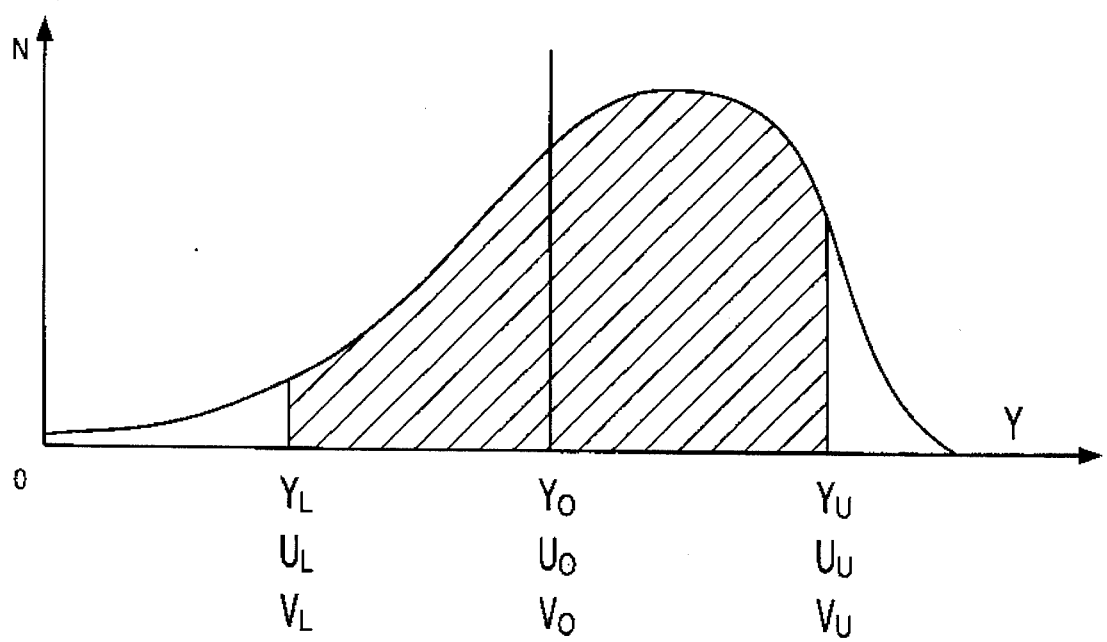
FIG. 4 is a graph of the typical captured pixel distribution offset from the test pixel value.

System noise such as quantization errors introduced by the D to A convertor 110 can modify the Y, U and V values of the pixels of an image transferred from the display VRAM 100 to the video output device 30. Similarly, system noise such as quantization errors introduced by the A to D convertor 140 can vary the Y, U, and V values of the pixels of an image transferred from video input device 10 to the capture VRAM 150. Therefore, with reference to FIG. 3, if the Y, U and V values of each pixel of an image stored in the display VRAM are respectively set, for instance, to Yo, Uo and Vo, the Y', U' and V' values of pixels of the same image when redigitized and stored in the capture VRAM 150 may be spread respectively about Yo, Uo and Vo in substantially symmetrical distributions. In practise, the quality of a captured image is acceptable if most of each of the captured Y', U' and V' values fall within preset upper and lower tolerance limits (Yl and Yu, Ul and Uu, Vl and Vu) symmetrically spaced about Yo, Uo, and Vo respectively. However, with reference to FIG. 4, the D to A convertor 110, output buffer 120, input buffer 130, and A to D convertor 140 may, in combination, introduce a gain factor that shifts the distribution of captured Y', U' and V' values respectively to one side of Yo, Uo and Vo in such a manner that the preset limits no longer define appropriate tolerances.

Referring back to FIG. 2, in accordance with the present invention, the display VRAM 100 and the capture VRAM 150 are both connected to analyzer logic 160 in the form of a microprocessor under the control of a computer program. The analyzer logic 160 has an input/output port 190 for communicating with the bus architecture 50 of the computer system. In operation, the analyzer logic 160 generates a binary control signal 180 for actuating a selector 170. When the control signal 180 is set to a first state, the selector connects the R', G', and B' video signals from the output buffer 120 to the video output device 30. However, when the control signal is set to a second state, the R', G', and B' video signals are connected to the input buffer 130. The analyzer logic 160 is also connected to a memory configured to serve as a look up table 185. The look up table 185 will be described in detail later on.

Figure 5:
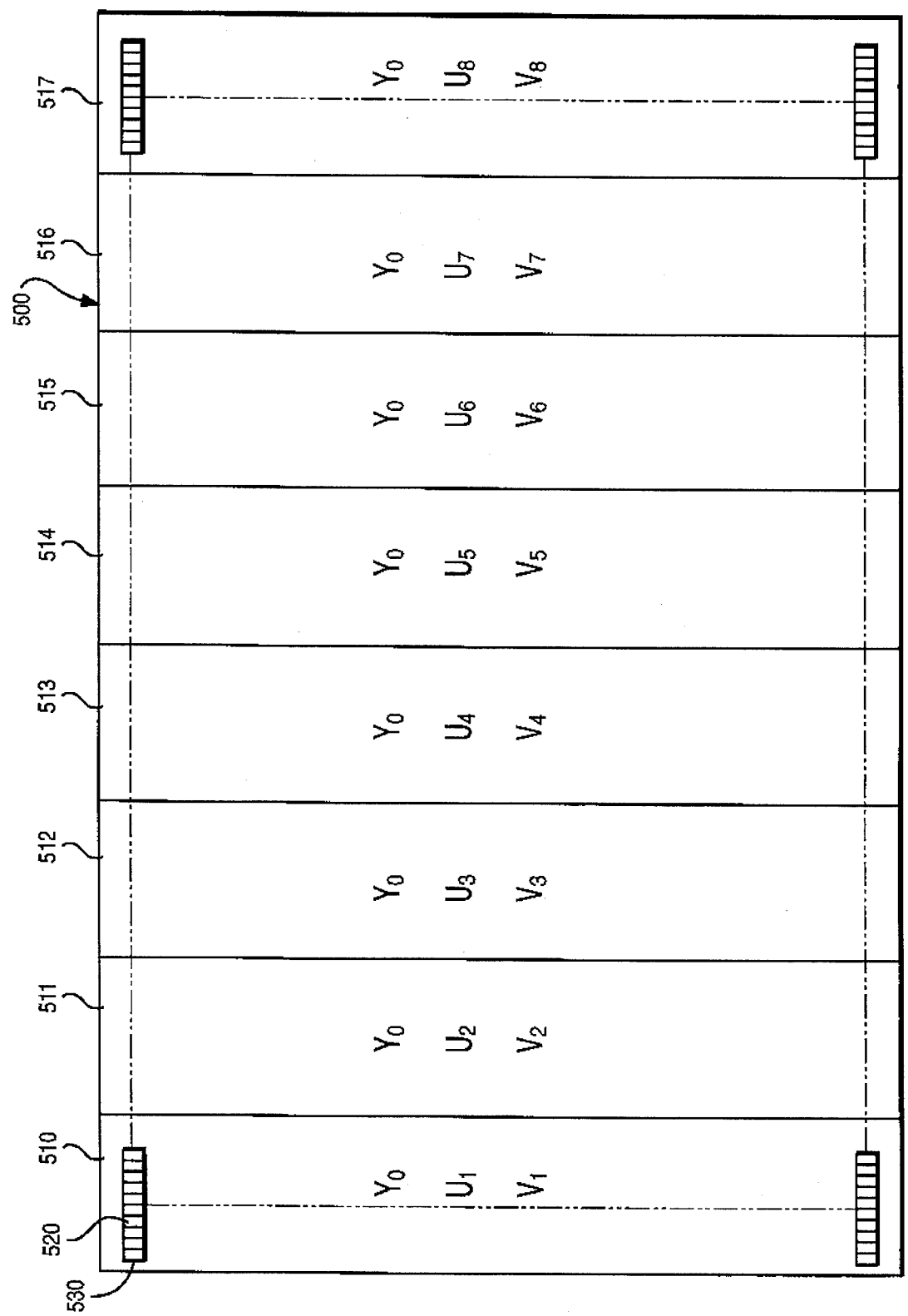
FIG. 5 is a test image generated by the image capture adaptor.

Referring now to FIG. 5, the analyzer logic 160 initially writes a test image 500 to the display VRAM 100. The test image 500 is in the form of eight vertical color bars, 510 to 517. Each bar is set to different one of a group of colors consisting of the three primary colors, the three secondary colors, black and white. The Y value of each pixel of the test image is set to Yo but, different U and V values (U1 to U8; V1 to V8) are assigned to pixels of different color bars.

Referring again to FIG. 2, the analyzer logic 160 sets the control signal to the second state to connect the output buffer 120 to the input buffer 130 thereby configuring the adaptor to operate in a test mode. The test image is read from the display VRAM 100 and converted to R, G, and B video signals by the D to A convertor 110. The R, G and B video signals are converted to digitized Y', U' and V' signals by the A to D convertor 140 and fed back or "wrapped" to the capture VRAM 150.

Referring back to FIG. 5, the analyzer logic 160 selects a block 520 of eight pixels from each color bar along sixty-four different lines, 530 to 539, of the captured test image stored in the capture VRAM 150.

Figure 6:
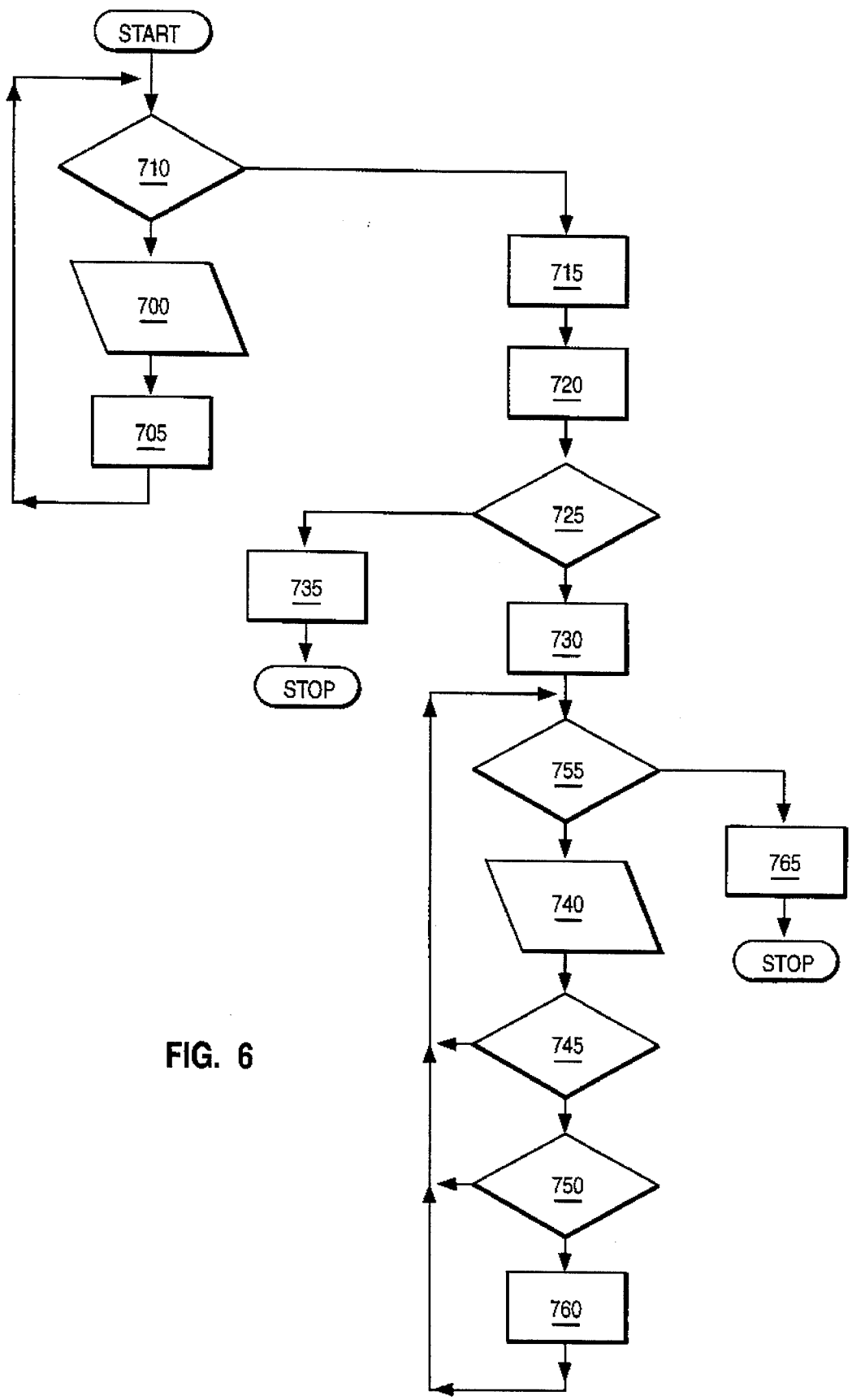
FIG. 6 is a flow diagram of analyzer logic for the image capture adaptor.

A preferred method of testing luminance encoding and decoding in the multimedia computer system will now be described with reference to FIG. 6.

At step 700, the analyzer logic 160 reads a Y' value of one of the selected pixels stored in the capture VRAM 150. At step 705, the analyzer logic 160 adds the Y' value to a running total. At step 710, the analyzer logic 160 determines whether or not there are any more Y' values to be read from the capture VRAM 150. If not, the analyzer logic 160 divides the running total, at step 715, by the number of selected pixels to generate a mean luminance, Yo'. If so, then at step 700 the analyzer logic 160 reads the Y' value of another one of the selected pixels.

Figure 7:
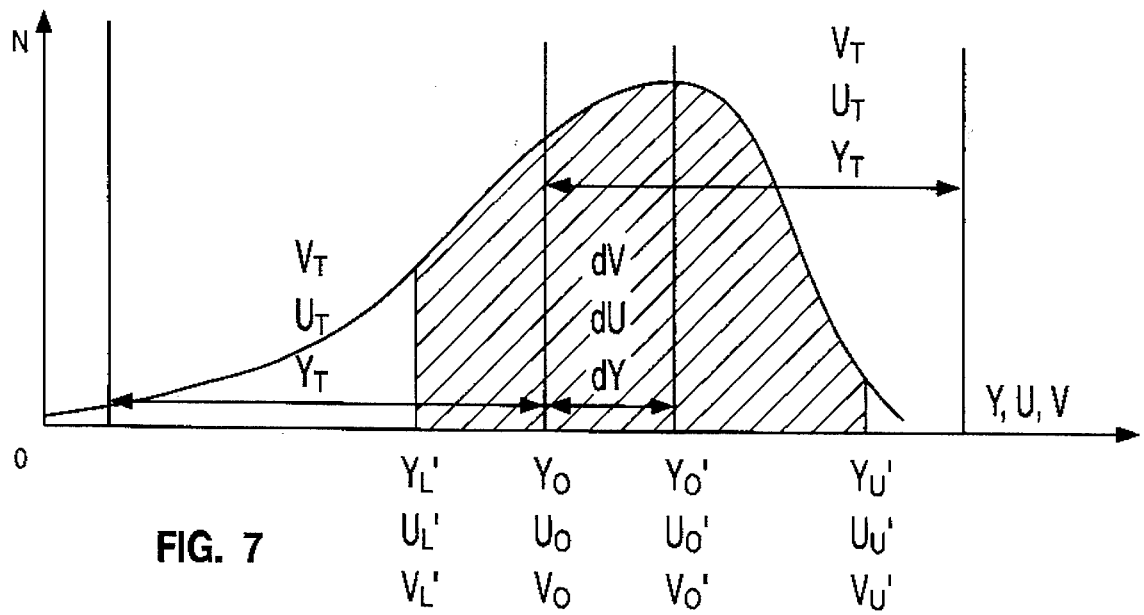
FIGS. 7 and 8 are graphs of typical captured pixel distributions with offset compensation.
Figure 8:
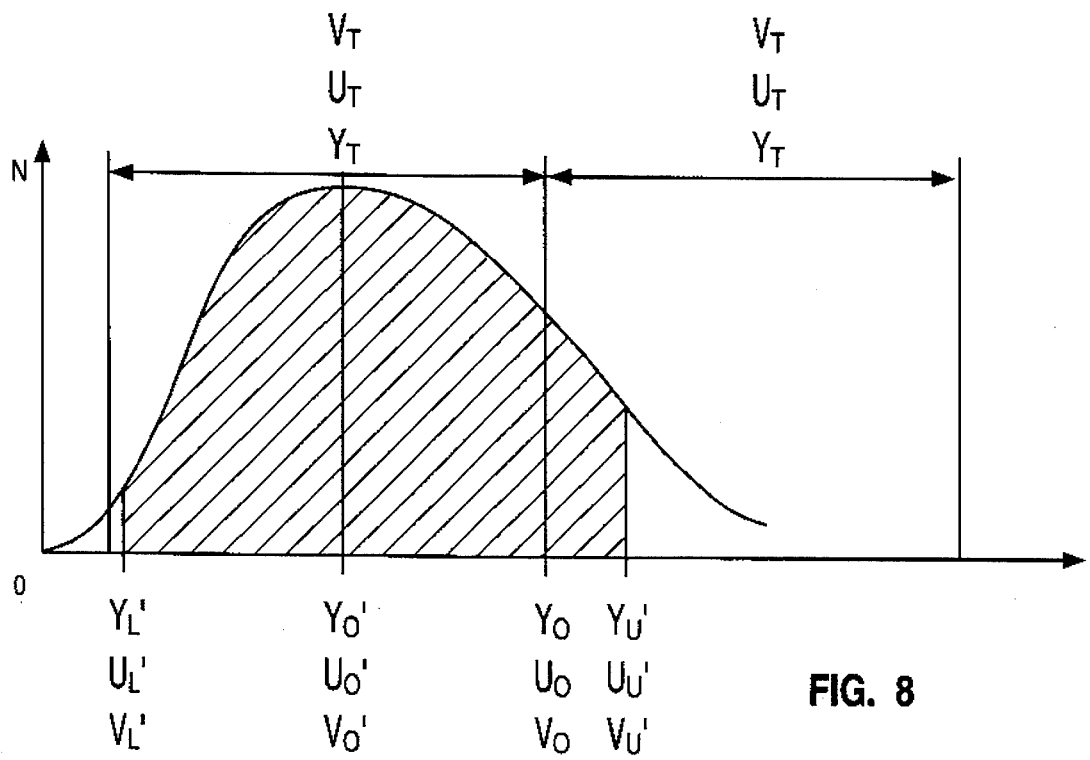

Referring now to FIGS. 7 and 8, at step 720, the analyzer logic 160 determines any difference dY between the mean, Yo', and Yo. At step 725 the analyzer logic 160 compares dY with a threshold value Yt. The threshold value Yt is preset to the difference between the midpoint and the extremes of the range of possible Y' values. If dY is greater than Yt, most if not all of the Y' values are at or near one or other of extremes. This may occur if, for example, the luminance conversion hardware is not functioning, or if the luminance amplification hardware is not functioning, or both are not functioning. Therefore, at step 735, the analyzer logic 160 indicates that a fundamental system fault exists. If dY is less than the threshold then, at step 730, the analyzer logic 160 adds dY to the upper and lower limits, to generate the offset lower and upper limits, Yu' and Yl'. The magnitude of dY provides a measure of degradation of captured luminance data introduced by the amplification hardware.

At step 740, the analyzer logic 160 rereads a Y' value of one of the selected pixels stored in the capture VRAM 150. If, at step 745, the analyzer logic 160 determines that the Y' value is greater than or equal to Y', and if, at step 750, the analyzer logic 160 determines that the same Y' value is less than or equal to Yu', the analyzer logic increments a count at step 760. If, at step 745, the analyzer logic 160 determines that the Y' value is less than Yl', or if, at step 750, the analyzer logic 160 determines that the Y' value is greater than Yu', then, at step 755, the analyzer logic 160 determines whether or not there are any more sample luminance values to be reread from the capture VRAM 100. If so, the analyzer logic 160 rereads the Y' value corresponding to another one of the selected pixels at step 740. If not, then at step 765 the analyzer logic 160 determines, from the count and the total number of sampled Y' values, the percentage of Y' values within the offset upper and lower limits Yu' and Yl' The percentage provides a measure of degradation of captured luminance data introduced by the conversion hardware.

The analyzer logic 160 can conveniently use substantially the same test to evaluate encoding and decoding of both saturation and hue. However, in the case of the former, the U' values of the selected pixels are read and, in the case of the latter, the V' values of the selected pixels are read. By way of example, a method of testing saturation encoding and decoding in a computer system of the present invention will now be described with reference again to FIG. 6.

At step 700, the analyzer logic 160 now reads a U' value of a one of the selected pixels of one 510 of the color bars stored in the capture VRAM. At step 705, the analyzer logic 160 adds the U' value to a running total. At step 710, the analyzer logic 160 determines whether or not there are any more U' values to be read from the color bar. If not, the analyzer logic 160 divides the running total, at step 715, by the number of selected pixels of the color bar to generate a mean saturation value, Un' (referring to FIG. 5, n is an integer between 1 and 8 inclusive). If so, then at step 700 the analyzer logic 160 reads the U' value of another one of the selected pixels of color bar 510.

Referring again to FIGS. 7 and 8, at step 720, the analyzer logic 160 determines any difference dU between the mean saturation value, Un', and the saturation value Un of the color bar stored in the display VRAM 100. At step 725, the analyzer logic 160 compares dU with a threshold value Ut. The threshold value Ut is preset to the difference between the midpoint and the extremes of the range of possible U' values. If dU is greater than Ut, most if not all of the U' values are at or near one or other of extremes. This may occur if, for example, the saturation conversion hardware is not functioning, or if the saturation amplification hardware is not functioning, or both are not functioning. Therefore, at step 735, the analyzer logic 160 indicates that a fundamental system fault exists. If dU is less than the threshold then, at step 730, the analyzer logic 160 adds dU to the upper and lower limits, Uu and Ul, to generate the offset lower and upper limits, Uu' and Ul' The magnitude of dU provides a measure of degradation of captured saturation data introduced by the amplification hardware.

At step 740, the analyzer logic 160 now rereads a U' value of one of the block of selected pixels of the first color bar stored in the capture VRAM 100. If, at step 745, the analyzer logic 160 determines that the U' value is greater than or equal to Ul' and if at step 750, the analyzer logic 160 determines that the same U' value U' is less than or equal to Uu' the analyzer logic 160 increments a count at step 760. If, at step 745, the analyzer logic 160 determines that the U' value is less than Ul' or if at step 750 the analyzer logic 160 determines that the saturation value U' is greater than Uu' then at step 755 the analyzer logic 160 determines whether or not there are any more U' values to be reread from the capture VRAM 100. If so, analyzer logic 160 rereads the U' value of another one of the selected pixels at step 740. If not, then at step 765 the analyzer logic 160 determines, from the count and the number of samples, ten, the percentage of the U' values within the offset upper and lower limits Uu' and Ul' The analyzer logic 160 then generates percentages corresponding to the remaining seven color bars, 511 to 517, in the same manner. The percentage provides a measure of degradation of captured luminance data introduced by the conversion hardware.

Because the human eye is more sensitive to the luminance of an image than the chrominance, the tolerance limits Yu and Yl applied to the captured Y' values are preferably set to provide a narrower band of acceptable values than those applied to the captured U' and V' values.

Referring back to FIG. 2, the look up table 185 contains a set of reference distributions of Y, U and V pixel data. Each distribution corresponds to a different failure mode of the adaptor 20. In operation, if the percentage of acceptable Y' values is below a predetermined threshold, the analyzer logic 160 compares the corresponding captured Y' value distribution with each of the Y reference distributions stored in the look up table 185 and determines the closest match to locate the fault. Likewise, if either the percentage of acceptable U' values or the percentage of acceptable V' values is below a predetermined threshold, the analyzer logic 160 compares the corresponding captured U' or V' value distribution with each of the appropriate one of either the U or the V reference distributions stored in the look up table and, again, determines the closest match to locate the fault.

Still referring to FIG. 2, it will be appreciated that the test image may be wrapped from the display VRAM 100 to the capture VRAM 150 via the video output device 30 and the video input device 10 instead of the switch 170 in such a manner that the present invention tests the multimedia computer system, and particularly the amplification hardware of the multimedia computer system, to a greater extent.

In the embodiment of the present invention hereinbefore described, each pixel is represented in both the display VRAM and the capture VRAM by nine bits. It will now be appreciated, however, that in other examples of the present invention, each pixel may be represented by more or less than nine bits. It will also be appreciated that, although eight blocks of eight pixels along sixty-four lines of the captured image were sampled in the embodiment of the present invention hereinbefore described, in other examples of the present invention more or less pixels of the captured image may be sampled to provide correspondingly greater or lesser accuracy. It will further be appreciated that, although the test image in the embodiment of the present invention hereinbefore described consists of eight vertical color bars, in other examples of the present invention different test images may be used to identify different faults. It will still further be appreciated that, although captured images are stored as arrays of luminance Y, saturation U and hue V data in the embodiment of the present invention hereinbefore described, in other examples of the present invention, captured images may be stored as arrays of red R, green G, and blue B data. It will also be appreciated that the present invention is equally applicable to monochrome multimedia computer systems in which only luminance data is captured. In the example of the present invention hereinbefore described, the analyzer logic is in the form of a microprocessor under the control of a computer program. However, it will now be appreciated that, in other embodiments of the present invention, the analyzer logic may be in the form of a hard-wired logic circuit.

I claim:

1. An image processing apparatus comprising:

a first memory for storing a plurality of digital data words corresponding to different pixels of an image;

a digital to analog convertor for converting the digital data words into an analog video signal;

an analog to digital convertor for converting the analog video signals into captured digital data values, each captured digital data value corresponding to a different one of the digital data words stored in the first memory;

a second memory for storing the captured digital data values;

analyzer logic coupled to the first and second memories, the analyzer logic comprising:

means for setting each digital data word in the first memory to a common test digital data value;

means for averaging captured digital data values derived from the test digital data value to generate a mean digital captured value;

means for determining any difference between the mean digital captured value and the test digital data value to identify any amplification error in the captured digital value data values;

means for determining first and second tolerance values respectively greater than and less than the mean captured digital value; and means for counting the captured digital data values between the first and second tolerance limits to identify any quantization errors in the captured digital data values.

2. The apparatus as claimed in claim 1, wherein the analyzer logic further comprises means for comparing the difference between the means captured digital value and the test digital data value with a first threshold to detect a functional failure in the image processing apparatus.

3. The apparatus as claimed in claim 1 wherein the analyzer logic comprises means for comparing the number of captured digital data values between the first and second tolerance limits with a second threshold to detect a conversion fault in the analog to digital convertor or the digital to analog convertor.

4. The apparatus as claimed in claim 2 wherein the analyzer logic comprises means for comparing the number of captured digital data values between the first and second tolerance limits with a second threshold to detect a conversion fault in the analog to digital convertor or the digital to analog convertor.

5. The apparatus as claimed in claim 3, wherein the analyzer logic further comprises means for determining which one of a plurality of reference digital data distributions stored in a look up table substantially corresponds to the captured digital data values to locate the conversion fault.

6. The apparatus claimed in claim 1 wherein the apparatus is adaptor card for a computer system.

7. A computer system comprising:

a first memory for storing a plurality of digital data words corresponding to different pixels of an image;

a digital to analog convertor for converting the digital data words into one analog video signal;

an analog to digital convertor for converting the analog video signals into captured digital data values, each captured digital data value corresponding to a different one of the digital data words stored in the first memory;

a second memory for storing the captured digital data values;

analyzer logic coupled to the first and second memories, the analyzer logic comprising:

means for setting each digital data word in the first memory to a common test digital data value;

means for averaging captured digital data values derived from the test digital data value to generate a mean captured digital value;

means for determining any difference between the mean captured digital value and the test digital data value to identify any amplification error in the captured digital data values;

means for determining first and second tolerance values respectively greater than and less than the mean captured digital data value; and means for counting the captured data values between the first and second tolerance limits to identify and quantization errors in the captured digital data values.

8. The computer system as claimed in claim 7 wherein the analyzer logic further comprises means for comparing the difference between the mean captured digital value and the test digital data value with the first threshold to detect a functional failure in the image processing apparatus.

9. The computer system as claimed in claim 8 wherein the analyzer logic comprises means for comparing the number of captured digital data values between the first and second tolerance limits with a second threshold to detect a conversion fault in the analog to digital convertor or the digital to analog convertor.

10. The computer as claimed in claim 9 wherein the analyzer logic comprises means for comparing the number of captured digital data values between the first and second tolerance limits with a second threshold to detect a conversion fault in the analog to digital convertor or the digital to analog convertor.

11. A computer system as claimed in claim 10, wherein the analyzer logic further comprises means for determining which one of a plurality of reference digital data distributions stored in a look up table substantially corresponds to the captured digital data values to locate the conversion fault.

* * * * *